United States Patent [19]

McNulty et al.

[11] Patent Number: 4,658,958
[45] Date of Patent: Apr. 21, 1987

[54] TRANSPARENT ARTICLE

[75] Inventors: James E. McNulty, Portland, Me.; Robert A. Neal, East Rd., Wales, Me. 04280

[73] Assignees: Robert A. Neal; Robert Ray, both of Green, Me.

[21] Appl. No.: 792,946

[22] Filed: Oct. 30, 1985

[51] Int. Cl.[4] ............... B65D 73/02; B65D 85/42
[52] U.S. Cl. .................................. 206/328; 428/922
[58] Field of Search .............. 361/212; 428/35, 408, 428/367, 247, 284, 285, 286, 922; 206/328, 524.4

[56] References Cited

U.S. PATENT DOCUMENTS

| | | | |
|---|---|---|---|
| 4,154,344 | 5/1979 | Yenni, Jr. et al. | 206/524.6 |
| 4,424,900 | 1/1984 | Petcavich | 206/328 |
| 4,529,087 | 7/1985 | Neal et al. | 206/328 |

Primary Examiner—Michael L. Gellner
Assistant Examiner—Brian W. Brown
Attorney, Agent, or Firm—Auslander & Thomas

[57] ABSTRACT

The invention pertains to a laminate having greater optical transparency, while remaining flexible. The laminate is most useful in fabricating envelopes or packages for electronic components featuring EMI and RFI shielding an electrostatic dissipation. The laminate comprises outer layers of an electrostatic free plastic and a middle layer of conductive fibers in a low density mat of between 0.2 and 0.5 ounces per square yard.

23 Claims, 6 Drawing Figures

TRANSPARENT ARTICLE

FIELD OF THE INVENTION

This invention features an optical transparent and flexible laminated article for generally packaging electronic components requiring EMI and RFI shielding and electrostatic dissipation.

BACKGROUND OF THE INVENTION

In recent times, it has been known to use conductive fiber mats in automobile plastic parts for the purposes of strengthening the plastic and to shield the car radio from electromagnetic engine emissions.

In the field of electronic packaging, electrostatic free bags have been constructed using carbon-impregnated plastic materials and metal foil.

Perforated metal foil has provided electronic envelopes with a certain degree of optical transparency, i.e., usually about 40 percent transparency.

When aluminum screens are used, the obtained optical transparency may be as much as 60 percent, but the laminate is generally inflexible.

This invention contemplates the use of a carbon-fiber mat as a middle layer disposed between two outer layers of electrostatic free, low-density polyethylene material to form an optically transparent and flexible laminate for electronic envelopes or packages requiring EMI and RFI shielding. The mat of electrically conductive fiber has a low density of about 0.2 ounces per square yard to about 0.5 ounces per square yard. Utilizing this low density material, optical transparencies approaching 70 to 80 percent can be achieved, particularly if the fibers are metal coated.

Excellent electrical shielding properties are achieved with fibers having a high length to diameter ratio, such as 0.75 inches or greater in length, to 7 or 8 microns in diameter.

The fibrous mat has a typical resistivity of less than one ohm centimeter.

DISCUSSION OF RELATED ART

It is know how to provide an electrically conductive web, which can be fabricated into floor mats, curtains and other articles. This type of web is disclosed in U.S. Pat. No. 4,208,696, issued June 17, 1980. The web is rendered electrically conductive by immersing a foraminous layer in carbon loaded chloroprene latex.

Reinforced laminated plastic material, such as bags, is taught in U.S. Pat. No. 3,445,055, issued May 20, 1969. The bag is constructed of woven plastic yarns, which may be coated or metallized.

A method of coating or metallizing carbon fibers, is described in U.S. Pat. No. 4,481,249, issued Nov. 6, 1984. Such fibers have been found useful in the manufacture of composite materials. However, there is no suggestion that such fibers could be used in the manufacture of electronic bags or envelopes.

Another patent that illustrates the use of carbon filaments in a resinous matrix is U.S. Pat. No. 3,406,126, issued Oct. 15, 1968.

A conductive resealable pouch is depicted in U.S. Pat. No. 4,496,406, issued Jan. 29, 1985. The pouch comprises open cell cushioning material sandwiched between electrostatic free material.

A method of making warp sheets, comprising carbon filaments, is disclosed in U.S. Pat. No. 3,660,197, issued Feb. 2, 1972. Warp sheets are useful in the production of laminates.

In U.S. Pat. No. 3,855,174, issued Dec. 17, 1974, composite materials comprising carbon fibers and resin, and a block of copolymer fixed to the carbon fibers, is shown.

An electrically conductive article of polyurethane or other plastic having coated electrically conductive fibers dispersed throughout, is depicted in U.S. Pat. No. 4,228,194, issued Oct. 14, 1980.

The conductive fibers do not have a high length to diameter ratio similar to the present invention, and would therefore not be expected to provide the shielding characteristics of the present invention.

In U.S. Pat. No. 4,356,228, issued Oct. 26, 1982, a moldable sheet reinforced with carbon fibers is disclosed. The fibers in this sheet are contemplated for use primarily for their mechanical strengthening capabilities.

Acrylonitrile fibers are disclosed in U.S. Pat. No. 4,347,279, issued Aug. 31, 1982, for their ability to form composite materials with improved impact strength.

BRIEF SUMMARY OF THE INVENTION

The invention relates to an optically transparent, flexible laminate, for general use in the manufacture of an electronic package, bag or envelope having good EMI and RFI shielding and electrostatic dissipation.

For purposes of definition, the term "envelope" shall mean a bag, package or other like container for housing electronic components and other small articles requiring electrostatic protection.

The laminate achieves its flexibility and optical transparency by using a middle layer containing a low density fibrous mat. By low density, it is meant that the fibers are widely separated or dispersed in the mat, sufficient to allow a high degree of light transmission through the laminate material, i.e., an optical transparency of greater than 50 percent. In order to achieve such an optical transparency, the density of the fibers should fall within the range of between 0.2 ounces per square yard and 0.5 ounces per square yard.

Higher optical transparency is achievable with coated or metallized fibers which do not absorb light.

The fibrous mat may be of woven or non-woven electrically conductive fibers of the carbon pitch or carbon PAN (polyacrylonitrile) type.

The mat is disposed between outer layers of flexible electrostatic free (sometimes referred to as antistatic) polymeric material, generally comprising low density polyethylene. The outer layers may contain electrostatic free agents such as amines or polyglycols. The electrostatic free polymeric materials may also comprise a polyolefin or nylon.

The laminate will have a surface resistivity on the outer layers of between $10^8$ and $10^{13}$ ohms per square.

The mat will generally have a resistivity of less than one ohm centimeter.

Excellent shielding is achieved by selecting the fibers in the mat with a high L/D (length to diameter ratio, i.e., a ratio greater than 0.75 inches of length to 7 to 8 microns in diameter. Shielding effectiveness exceeded 25 dB at frequencies of 1 to 10 GHz for both coated and uncoated carbon fibers at densities of 0.2 ounces per square yard, or more.

The laminate of this invention may be fabricated by extruding the electrostatic free polymer onto both sides of the fiber mat, or by adhesively bonding the polymeric electrostatic free material upon both sides of the fiber mat.

BRIEF DESCRIPTION OF THE DRAWINGS

Although such novel feature or features believed to be characteristic of the invention are pointed out in the claims, the invention and the manner in which it may be carried out, may be further understood by reference to the description following and the accompanying drawing.

DETAILED DESCRIPTION OF THE INVENTION

Referring now to the figures in greater detail, where like reference numbers denote like parts in the various figures.

Generally speaking, the invention features an optically transparent, flexible laminate that is useful in fabricating envelopes for electronic components. The laminate provides excellent electrical properties that shield the electronic component from EMI and RFI. The laminate also provides excellent electrostatic dissipation.

Figure 1:
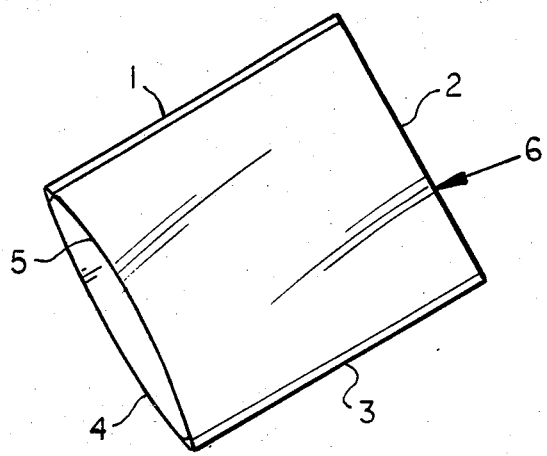
FIG. 1 is a perspective view of an envelope fabricated according to the laminate of the invention.

Referring now to FIG. 1, an envelope 6 fabricated with the laminate of the invention is illustrated. The envelope 6 is constructed by folding the laminate at the bottom edge 2, and heat sealing the laminate at the side edges 1 and 3 to form a pouch, whose open mouth is defined by top and bottom edges 5 and 4, respectively.

Figure 3:
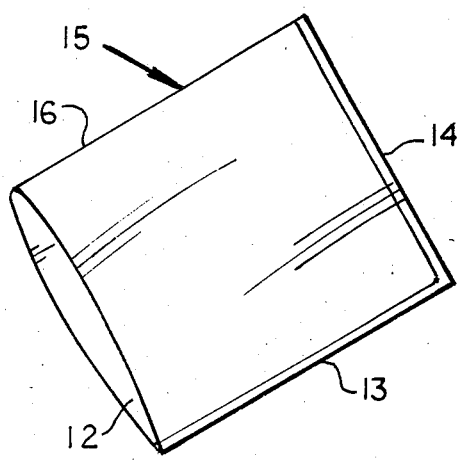
FIG. 3 is a perspective view of an alternate envelope construction with respect to that shown in FIG. 1.

A bag-shaped envelope 15 can be constructed, as shown in FIG. 3. In this embodiment, the laminate may be folded along a side edge 16 and heat sealed along the bottom edge 14 and the opposite side edge 13, forming the bag 15 with the opening 12.

Figure 2:
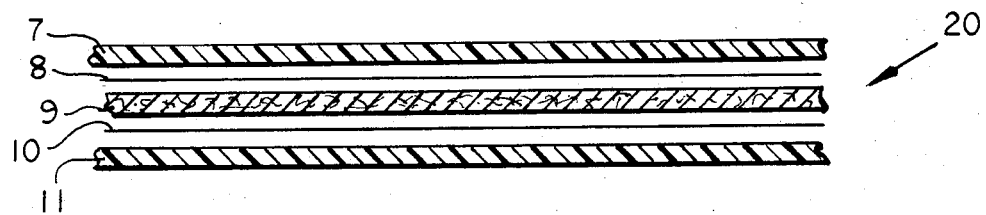
FIG. 2 is a sectional view of the laminate of the invention.
Figure 4:
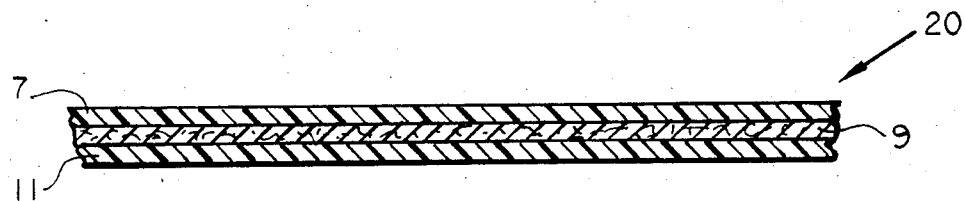
FIG. 4 is a sectional view of an alternate laminate construction with respect to that illustrated in FIG. 2.

Referring to FIGS. 2 and 4, the laminate 20 of this invention is sectionally shown in two different embodiments.

In FIG. 4, the laminate is comprised of top and bottom transparent layers 7 and 11, respectively, of electrostatic free, flexible plastic material, such as low density polyethylene, polyolefin or nylon. Antistatic agents may be added to the plastic, such as amines and polyglycols. The surface resistivity of these layers can range from $10^8$ to $10^{13}$ ohms per square. Between the layers 7 and 11 is disposed a fibrous mat 9, having a density ranging approximately between 0.2 ounces per square yard and 0.5 ounces per square yard. The low density of the fibers in the mat 9 provides for improved optical transparency, as high as 80 percent.

The fibrous mat 9 may comprise any electrically conductive fiber, such as carbon of the pitch or PAN (polyacrylonitrile) type. The fibers can be coated with metals, such as nickel, to improve shielding and the transparent effects.

Shielding effectiveness exceeded 25 dB at frequencies of 1 to 10 GHz for both coated and uncoated carbon fibers at densities of 0.2 ounces per square yard, or more.

The mat 9 may be woven or non-woven.

Figure 5:
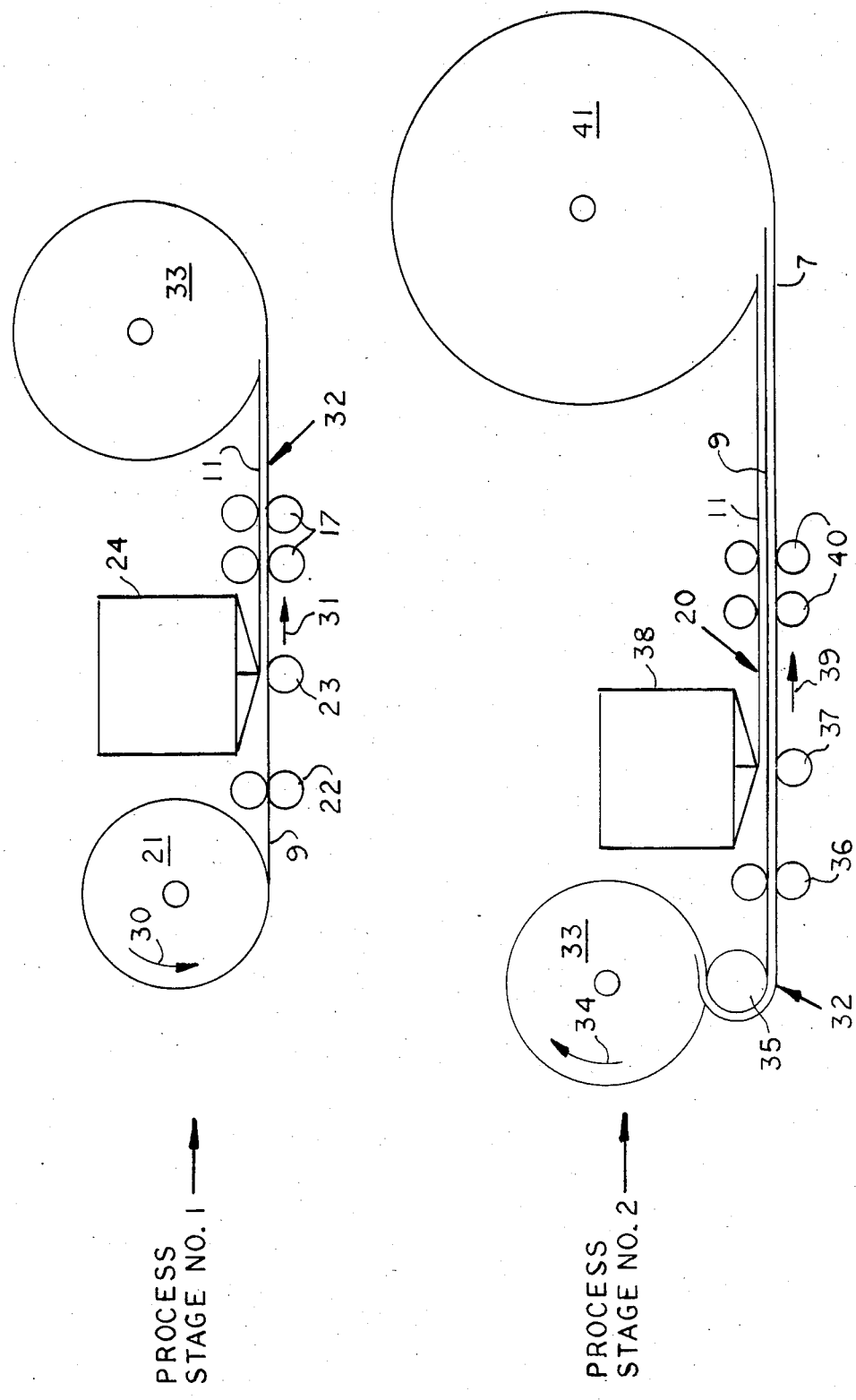
FIG. 5 is a schematic view of an apparatus for fabricating the extruded laminate depicted in FIG. 4.

The layers 7, 9, and 11 of FIG. 4 are coextruded by a two-stage process described with reference to FIG. 5. The electrically conductive fibrous mat 9 in the first stage of the process is stored upon a rotatable drum 21. The mat 9 is unwound (arrow 30) from drum 21 and passes between two feed rollers 22 to a support roller 23.

Above the support roller 23 is positioned an extruder 24 which deposits a layer of electrostatic free material upon one side of the mat 9. The mat and electrostatic free layered composite then passes (arrow 31) to a double pair of chill rollers 17 that cools the heated materials. From here, the composite mat and electrostatic free layers 32 passes to a rotatable storage drum 33.

In a second stage of the process, the storage drum 33 is unwound (arrow 34) with composite 32 passing around a reversing roller 35 to position the uncoated side of mat 9 of composite 32 at the top. The composite 32 passes between feed rollers 36 to a support roller 37. Above the support roller 37 is positioned an extruder 38, which deposits another layer of electrostatic free material on the uncoated side of mat 9. The laminate 20, now comprising the composite layers 7, 9 and 11, as shown in FIG. 4, is made to pass (arrow 39) to a double pair of chill rollers 40 to cool the laminate composite 50, which is then stored upon rotatable drum 41.

Figure 6:
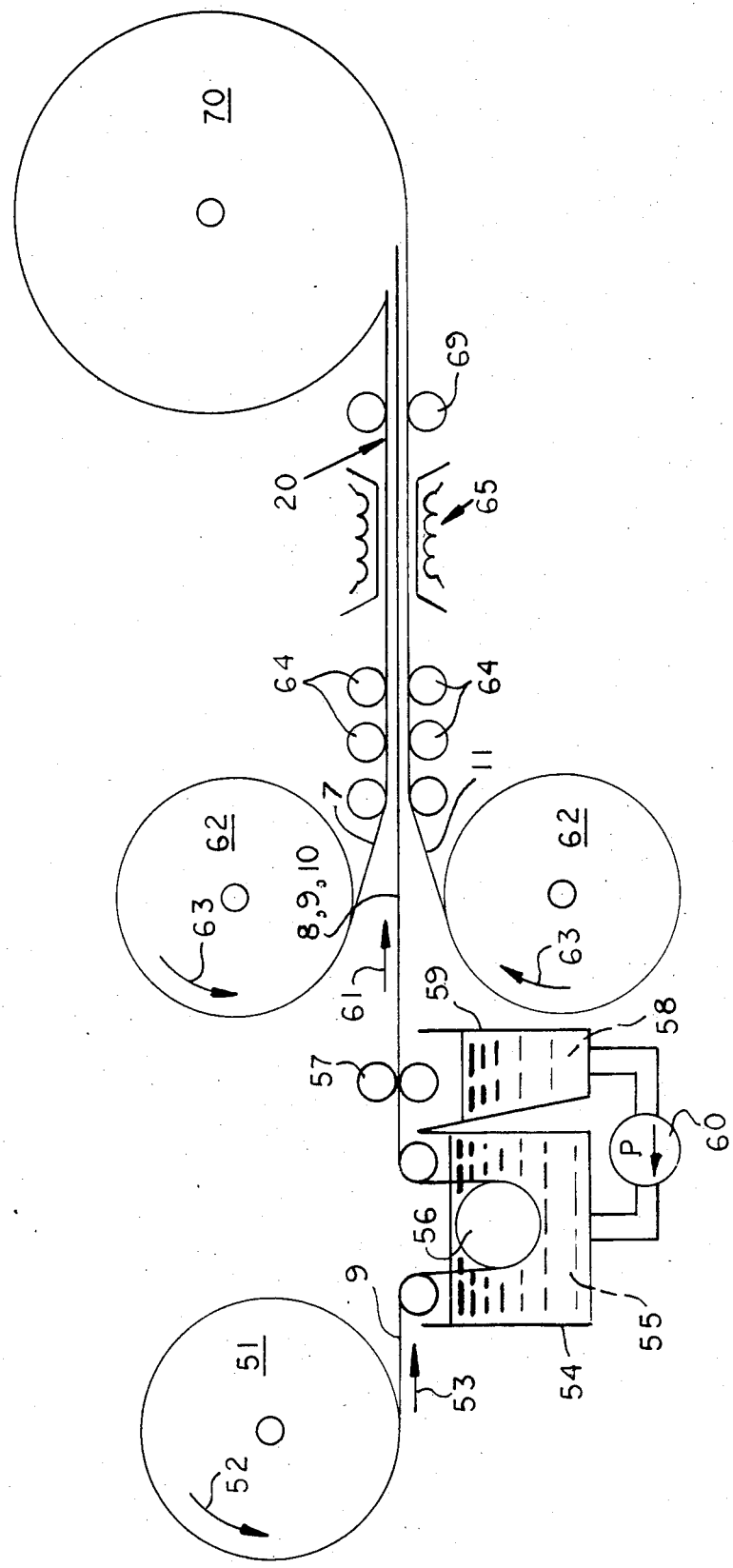
FIG. 6 is a schematic view of an apparatus for fabricating the adhesively constructed laminate shown in FIG. 2.

Referring to FIG. 2, the same laminate of FIG. 4 may be fabricated by an adhesively bonded process. described hereinafter with respect to FIG. 6.

In FIG. 2, the mat 9 is adhesively bonded to layers 7 and 11, respectively, by adhesive layers 8 and 10, respectively. The adhesive can be any suitable adhesive, such as a Minnesota Manufacturing and Mining Co. pressure sensitive adhesive No. 4910, or equivalent.

The process for fabricating the laminate of FIG. 2 will now be described with reference to FIG. 6. A conductive fiber mat 9 is stored upon a rotatable drum 51. The drum 51 is unwound (arrow 52) and passes (arrow 53) into a tank 54 containing the aforementioned adhesive. The mat 9 is immersed in the adhesive 55, passes around a support drum 56 and is fed to a pair of squeeze rollers 57 that remove the excess adhesive. The excess adhesive 58 falls into tank 59, where it is filtered and pumped back into tank 54 via pump 60. The adhesive containing mat, layers 8, 9 and 11, respectively, is then fed (arrow 61) between two rotatable storage drums 62, that house the electrostatic free plastic materials. Each drum 62 simultaneously unwinds (arrows 63) a layer, 7 and 11 respectively, of electrostatic free plastic above and below the adhesive-containing mat, layers 8, 9 and 10, respectively. The total laminate 20, comprising the composite layers 7, 8, 9, 10 and 11 is fed between a series of pressure rollers 64, and then to a heating dryer 65.

The dried laminate 20 of FIG. 2 is then fed to storage drum 70, via feed rollers 69.

The laminates 20, described herein, are characterized both by their flexibility and their greater optical transparency, which has been achieved herein for the first time.

The terms and expressions which are employed are used as terms of description; it is recognized, though, that various modifications are possible.

It is also understood the following claims are intended to cover all of the generic and specific features of the invention herein described; and all statements of the scope of the invention which as a matter of language, might fall therebetween.

Having described certain forms of the invention in some detail, what is claimed is:

1. An optically transparent, flexible laminate, comprising:
    a first transparent, flexible layer of electrostatic free material;
    a second transparent, flexible layer of electrostatic free material; and
    a third transparent, flexible layer disposed between said first and second transparent layers comprising a mat of electrically conductive fibers in an approximate weight range of between 0.2 ounces per square yard and 0.5 ounces per square yard.

2. An envelope article comprising the optically transparent laminate of claim 1.

3. The optically transparent, flexible laminate of claim 1, further comprising an adhesive layer disposed between said first and third layer and said second and third layer.

4. The optically transparent, flexible laminate of claim 1, wherein the fibers of the mat have a length to diameter ratio of approximately at least 0.75 inches in length to 8 microns in diameter.

5. The optically transparent, flexible laminate of claim 1, wherein the fiber mat comprises woven fibers.

6. The optically transparent laminate of claim 1, wherein the fiber mat comprises non-woven fibers.

7. The optically transparent, flexible laminate of claim 1, wherein the fiber mat comprises coated fibers.

8. The optically transparent, flexible laminate of claim 7, wherein the coated fibers are coated with a metal.

9. The optically transparent, flexible laminate of claim 8, wherein said metal comprises nickel.

10. The optically transparent, flexible laminate of claim 1, wherein the fiber mat comprises carbon fibers.

11. The optically transparent, flexible laminate of claim 10, wherein said carbon fibers are of the polyacrylonitrile type.

12. The optically transparent, flexible laminate of claim 10, wherein said carbon fibers are of the pitch type.

13. The optically transparent, flexible laminate of claim 1, wherein said surface resistivity of said first and second electrostatic free layers is aproximately between $10^8$ and $10^{13}$ ohms per square.

14. The optically transparent, flexible laminate of claim 1, wherein the mat of fibers has a resistivity of approximately less than one ohm centimeter.

15. The optically transparent, flexible laminate of claim 1, wherein said first and second electrostatic free material comprises a low density polyethylene.

16. The optically transparent, flexible laminate of claim 1, wherein said laminate is manufactured by an extrusion coating process.

17. The optically transparent, flexible laminate of claim 1, wherein said first and second layers are each comprised of a heat sealable, extrudable, flexible, electrostatic free, polymeric material.

18. The optically transparent, flexible laminate of claim 17, wherein said polymeric material can comprise a polyolefin or a nylon.

19. The optically transparent, flexible laminate of claim 17, wherein said polymeric material can contain antistatic agents.

20. The optically transparent, flexible laminate of claim 19, wherein said antistatic agents can comprise amines or polyglycols.

21. The optically transparent, flexible laminate of claim 1, wherein said laminate has a transparency of over 50 per cent.

22. The optically transparent, flexible laminate of claim 1, wherein said mat comprises metal coated fibers, and further wherein the optical transparency of said laminate is approximately in a range between 70 and 80 per cent.

23. The optically transparent laminate of claim 1, wherein shielding effectiveness at frequencies of 1 to 10 GHz exceeds 25 dB.

* * * * *